(12) United States Patent
Aggerstam et al.

(10) Patent No.: US 6,885,690 B2
(45) Date of Patent: Apr. 26, 2005

(54) TRANSVERSE MODE AND POLARIZATION CONTROL OF SURFACE EMITTING LASERS THROUGH THE FORMATION OF A DIELECTRIC STACK

(75) Inventors: Thomas Aggerstam, Solna (SE); Rickard von Wurtemberg, Stockholm (SE)

(73) Assignee: Zarlink Semiconductor AB, Jarfalla (SE)

( * ) Notice: Subject to any disclaimer, the term of this patent is extended or adjusted under 35 U.S.C. 154(b) by 0 days.

(21) Appl. No.: 10/242,070

(22) Filed: Sep. 12, 2002

(65) Prior Publication Data

US 2003/0063642 A1 Apr. 3, 2003

(30) Foreign Application Priority Data

Sep. 15, 2001 (GB) .............................. 0122379

(51) Int. Cl.[7] .............................. H01S 3/08; H01S 5/00
(52) U.S. Cl. ............................. 372/96; 372/45
(58) Field of Search ............................. 372/96, 45, 46, 372/42

(56) References Cited

U.S. PATENT DOCUMENTS

| 5,115,441 | A | 5/1992 | Kopf et al. |
| 5,940,422 | A | 8/1999 | Johnson |
| 5,953,362 | A | 9/1999 | Pamulapati et al. |
| 5,995,531 | A | 11/1999 | Gaw et al. |
| 6,002,705 | A | 12/1999 | Thornton |
| 6,055,262 | A | 4/2000 | Cox et al. |
| 6,154,479 | A | 11/2000 | Yoshikawa et al. |
| 6,185,241 | B1 * | 2/2001 | Sun .............................. 372/96 |
| 6,188,711 | B1 | 2/2001 | Corzine et al. |
| 6,339,496 | B1 * | 1/2002 | Koley et al. ................. 359/344 |
| 2002/0080836 | A1 * | 6/2002 | Hwang ........................ 372/45 |
| 2002/0191659 | A1 * | 12/2002 | Skogman ..................... 372/46 |
| 2003/0006407 | A1 * | 1/2003 | Taylor .......................... 257/12 |

FOREIGN PATENT DOCUMENTS

| DE | 19945128 A1 | 8/1981 |
| GB | 2349739 | 11/1999 |
| WO | WO 00/45483 | 8/2000 |

OTHER PUBLICATIONS

K. Panajotov, B. Nagler, G. Verschaffelt, A. Georgievski, M. Thienpont, J. Danckaert, and I. Veretenicoff; Impact of in–plane anisotropic strain on the polarization behavior of vertical–cavity surface–emitting lasers; Published Jul. 15, 2000; 3 Pages;vol. 77, No. 11; 2000 American Institute of Physics; Brussels, Belgium.

Strelecka et al., "Single Mode, Low Impedance 850–nm VCSELs Integrated Mode Filters", Digest of the LEOS Summer Topical Meetings, 2001, Aug. 2001, pp. 51–52.

* cited by examiner

Primary Examiner—Don Wong
Assistant Examiner—Hung T Vy
(74) Attorney, Agent, or Firm—Lawrence E. Laubshcer, Jr.

(57) ABSTRACT

A vertical cavity surface emitting laser (VCSEL) having asymmetrical optical confinement is described. Polarization of VCSELs having symmetrical structures tend to be unpredictable and switchable. The VCSEL of the present invention has a dielectric stack on top of the emitting distributed Bragg mirror. The stack is made up of two or more layers of dielectric material with each alternate layer having one of two different refractive indexes. In a preferred embodiment an antireflective coating is between the top mirror and the dielectric layers. The stack is preferably smaller than the emitting aperture.

14 Claims, 3 Drawing Sheets

TRANSVERSE MODE AND POLARIZATION CONTROL OF SURFACE EMITTING LASERS THROUGH THE FORMATION OF A DIELECTRIC STACK

FIELD OF THE INVENTION

This invention relates to surface emitting laser structures and more particularly to such lasers having a dielectric mirror structure for transverse mode and polarization control.

BACKGROUND

Surface emitting laser structures such as vertical cavity surface emitting lasers (VCSELs) have gained significant importance in the field of optical communications. The high switching speed offered by semiconductor lasers employing, for example, III–V alloy compounds have made such devices a logical choice for optical transmitters. For several reasons including; reliability, ease of coupling, and testing, VCSELs have gained acceptance over the more conventional edge emitting devices. VCSELs are typically fabricated using well known planar processes and equipment and are well suited for integration with other active and passive components.

Typically, VCSELs have a common back contact and an apertured contact on the emitting face with the emission from the optical device exiting through the aperture. The contact aperture is usually circular as this is better suited for alignment with optical fibers.

Polarization of the light from such standard VCSELs is unpredictable as it tends to be randomly oriented from one device to another. Further, polarization may switch in operation particularly at high speeds. The polarization of light emitting from a VCSEL can be important especially when used in conjunction with polarization sensitive components and efforts have been made in an attempt to tailor or control VCSEL polarization.

In an article published by Fiedler et al. entitled "High Frequency Behaviour of Oxidized Single-Mode Single Polarization VCSELs with Elliptical Current Aperture", Lasers and Electro-Optic Society annual meeting 1996 IEEE volume 1, 1996, pages 211 to 212 there is discussed a technique wherein oxidized VCSELs are provided with elliptical current apertures in an effort to control polarized single mode light emission.

An article entitled "Impact of In-Plane Anistropic Strain on the Polarization Behavior of Vertical-Cavity Surface-Emitting Lasers" by Panajotov et al. (Applied Physics Letters, Volume 77, Number 11, Sep. 11, 2000) discloses an externally induced in-plane anisotropic strain applied to a VCSEL in order to demonstrate the presence of switching between two fundamental modes with orthogonal linear polarization.

Externally applied strain or stress to control polarization of VCSELs was also described in U.S. Pat. No. 6,188,711 to Corzine et al.

U.S. Pat. No. 6,002,705 which issued Dec. 14, 1999 to Thornton describes wave length and polarization multiplexed vertical cavity surface emitting lasers in which stress inducing elements are disposed on a free surface of the laser device. The stress inducing elements are made of a material having a higher coefficient of thermal expansion than the material which comprises the surface layer of the laser device.

U.S. Pat. No. 5,953,962 which issued Sep. 14, 1999 to Pamulapati et al. describes a strain induced method of controlling polarization states in VCSELs. In the 5,953,962 patent the VCSEL is eutectically bonded to a host substrate which has a predetermined anisotropic coefficient of thermal expansion. During the forming process a uniaxial strain is induced within the laser cavity.

U.S. Pat. No. 6,154,479 which issued Nov. 28, 2000 to Yoshikawa et al. discloses a VCSEL in which control of the polarization direction is effected by limiting the cross sectional dimension of the top mirror so as to limit only a single fundamental transverse mode in the wave guide provided by the mirror. A non-circular or elliptical device is created so as to control the polarization.

U.S. Pat. No. 5,995,531 which issued Nov. 30, 1999 to Gaw et al. also discloses an elliptical cross sectional top mirror which is formed into a ridge with the ridge being etched down into an ion implantation region to form an elongated shape so as polarize light emitted by the device. It is also known in the prior art to use rectangular air-post structures, asymmetric oxide apertures and an elliptical hole on the bottom emitting laser as ways of controlling polarization.

All of the above methods involve complex fabrication and/or processing steps and what is needed is a simple technique of controlling and stabilizing polarization of VCSELs.

One solution to the aforementioned problem of polarization switching particularly when the VCSEL is operated with large modulating signals is described in Applicant's co-pending British Application 1006192.6 filed Jul. 3, 2001.

Typically, laser action in a VCSEL is in one longitudinal mode only due to the short cavity length. On the other hand, laser action in a VCSEL may be supported in multiple transverse modes if the emitting aperture is large enough to support such operation. It is known that in multi mode VCSELs mode partition noise (MPN) occurs when individual modes compete for carriers. With a single mode there is no MPN to degrade the performance of the VCSEL. Further, if the single mode is the fundamental mode the beam will have a Gaussiam electromagnetic field distribution. The Gaussiam beam has a smaller spot size and a smaller divergence than the higher order lateral modes in the VCSEL. This is an advantage for all applications wherein a small spot and low divergence is important. This includes applications wherein a small circular spot is an advantage i.e. read-out technology. The small spot size is of great benefit because the alignment to the fiber becomes easier. In addition, a small spot size and a low divergence angle makes it possible to launch the light into the core of a fiber which in turn increases the distance data can be sent at a high rate.

Polarization switching is a known phenomenon, as previously discussed, and such polarization switching may cause mode hopping in VCSELs. Thus, a switching (or a hopping) between the polarization modes may alter the static and dynamic properties of the laser and significantly degrade the communication link. Additionally, transmission could be degraded further because of an isotropy in the optical fiber. Even though the circular output profile of the single mode is of great benefit for the coupling to a fiber, the unstable polarization state caused by the symmetry of the aperture will tend to reduce the benefit. Thus, by introducing asymmetry the polarization can be stabilized or at least controlled with a relatively small trade off.

SUMMARY OF THE INVENTION

The principle behind the present invention is to control mode selection by introducing spatially dependent optical cavity loss to a laser such as a VCSEL. This is introduced by a dielectric stack on top of the VCSEL device. In order to increase the optical loss for higher order modes that are more wide spread (spatially extended) an anti-reflection (AR) coating layer should be present around the dielectric stack.

It is, therefore, the intention of the present invention to control the transverse mode and polarization of a VCSEL with the formation of a dielectric mirror structure on top of the distributed Bragg reflector of the VCSEL. The dielectric mirror is comprised of alternating high and low index materials with a thickness of $\lambda/4$ which is the nominal value (the optical path length). This can also be stated as $L=\lambda/4+n\times\lambda/2$ where n is an integer. The mirrors are selectively etched to form an aperture or air post. The aperture can be symmetric to provide transverse mode control or asymmetric to provide transverse mode and polarization control.

Therefore, in accordance with a first aspect of the present invention there is provided a surface emitting laser having an active layer sandwiched between first and second mirrors and first and second contacts on the first and second mirrors for use in providing operating power to the laser, the improvement comprising a dielectric mirror structure on one of the first and second mirrors.

In accordance with a second aspect of the invention there is provided a method of controlling mode selection in a surface emitting laser having an active layer sandwiched between first and second mirrors, each mirror having associated contacts for use in providing operating power to the laser, the method comprising; providing a dielectric mirror structure to one of the mirrors to selectively adjust a spatially dependent cavity loss within laser.

In a preferred aspect of the surface emitting laser is a VCSEL.

BRIEF DESCRIPTION OF THE DRAWINGS

The invention will now be described in detail with reference to the attached drawings wherein.

DETAILED DESCRIPTION OF THE INVENTION

Although the following description refers specifically to a VCSEL it is to be understood that the concepts apply to any surface emitting laser structure where control of the spatial spread is of interest.

Figure 1:
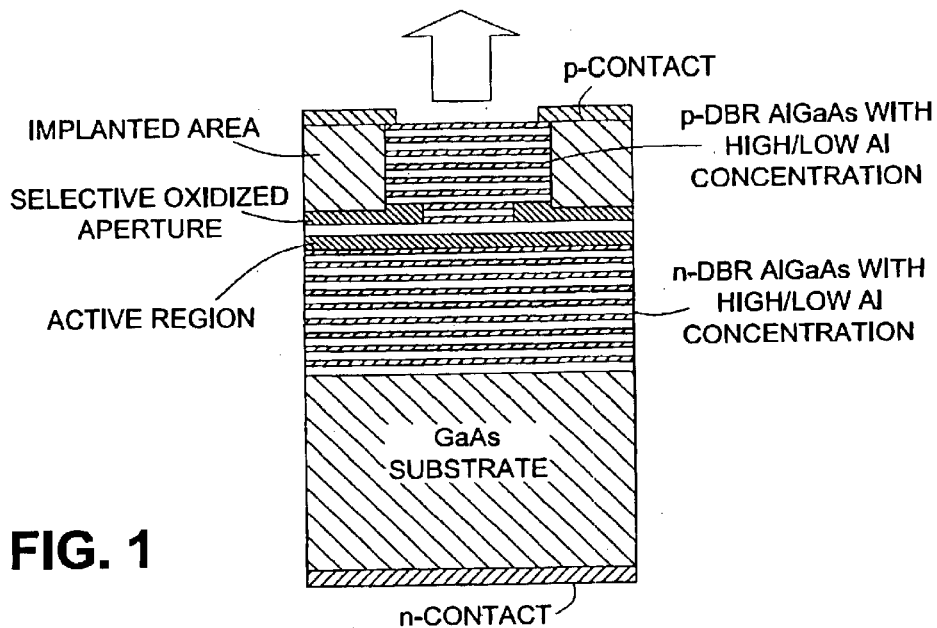
FIG. 1 is a cross sectional view of a VCSEL as described in the aforementioned co-pending British application.

FIG. 1 illustrates the basic construction of a typical aluminum gallium arsenide (AlGaAs) VCSEL as described in Applicant's co-pending application. Although FIG. 1 refers to a specific VCSEL structure and in particular an 850 nm p-up configuration the VCSEL could consist of other material systems for use in emitting at other wavelengths. It is well known that different laser structures and materials can be used to tailor the output wavelength of the emission. Further, the structure shown in FIG. 1 has a p-type top DBR whereas it is also possible that the top DBR would be n-type.

In the device of FIG. 1, the VCSEL structure is grown on a gallium arsenide (GaAs) substrate by well known techniques such as metal organic vapor phase epitaxy. Preferably the structure is grown in one single epitaxial run. The gallium arsenide substrate in a typical structure is n-type, as is the bottom distributed bragg reflector (DBR) also known as a Bragg mirror. The n-DBR consists of $\lambda/4$ $Al_xGa_{1-x}As$ alternating high and low index layers. It is to be understood that the quarter wavelength or $\lambda/4$ as shown is the nominal value for the optical path length. This length could also be written as $L=\lambda/4+n\times\lambda/2$ where n is an integer and L is the optical path length. The active layer on top of the bottom mirror is a $m\times\lambda/2$, long cavity comprising multiple quantum wells. In a particular embodiment of the invention the active region is a 1-$\lambda$ long AlGaAs/GaAs, multi quantum-well (MQW) region. A second Bragg mirror or DBR of p-type AlGaAs with high/low aluminum concentration is grown on top of the active layer. An apertured p-type contact is created on the top mirror and an n-contact is plated on the gallium arsenide substrate. Typically, an ion implanted area is created in the p-DBR to confine the current path between the p-contact and the n-contact. Also shown in FIG. 1 is a layer identified as selective oxidized aperture which is one layer of the p-DBR which has a higher aluminum concentration then the other layers in the stack. The purpose of this oxidizable layer will now be described.

It has been established that AlGaAs layers with a high aluminum content can be oxidized in the presence of heated vapour. Typically, an oxidizable layer is grown in the top DBR and then the DBR is etched to form a mesa to thereby expose the edge of the oxidizable layer. The device is then treated in a vapor atmosphere at an elevated temperature and the oxidization proceeds from the exposed area towards the center. By selecting an appropriate treatment time the oxidized layer will proceed inwardly from all sides leaving a central unoxidized layer. This central unoxidized aperture is used to provide a current confinement region.

In U.S. Pat. No. 5,896,408 to Corzine et al. the oxidized layer is formed by etching apertures from the top surface of the device down to the oxidizable layer and then exposing the structure to a vapor atmosphere. By forming a pattern of etched apertures down to the oxidizable layer the current confining region is controlled.

Figure 2:
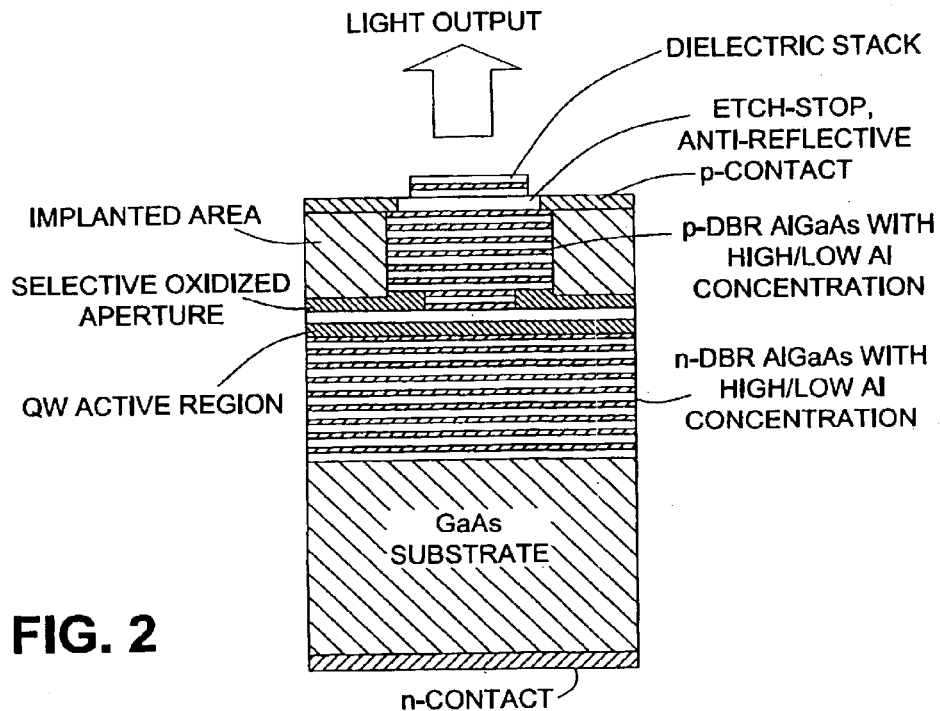
FIG. 2 is a cross sectional view of one embodiment of the present invention showing a dielectric stack.

As shown in FIG. 2 the basic structure of the VCSEL of the present invention is similar to that which is shown in FIG. 1. The improvements according to the present invention relate to the dielectric stack on top of the top or p DBR mirror and the etch stop/anti-reflective coating on top of the emitting aperture.

The principle of the anti-reflective layer is to reduce the reflected wave and thereby to increase the transmitted wave. The two requirements to create an exact cancellation of the reflected beams with a single layer coating are that the reflections are exactly 180° out of phase and of the same intensity. The reflective intensity is taken care of by the choice of material which is governed by Fresnel's equations while the thickness of the layer needs to be chosen for exact phase cancellation. Since the thickness of this anti-reflection layer is crucial the process needs to be well controlled.

Figure 3:
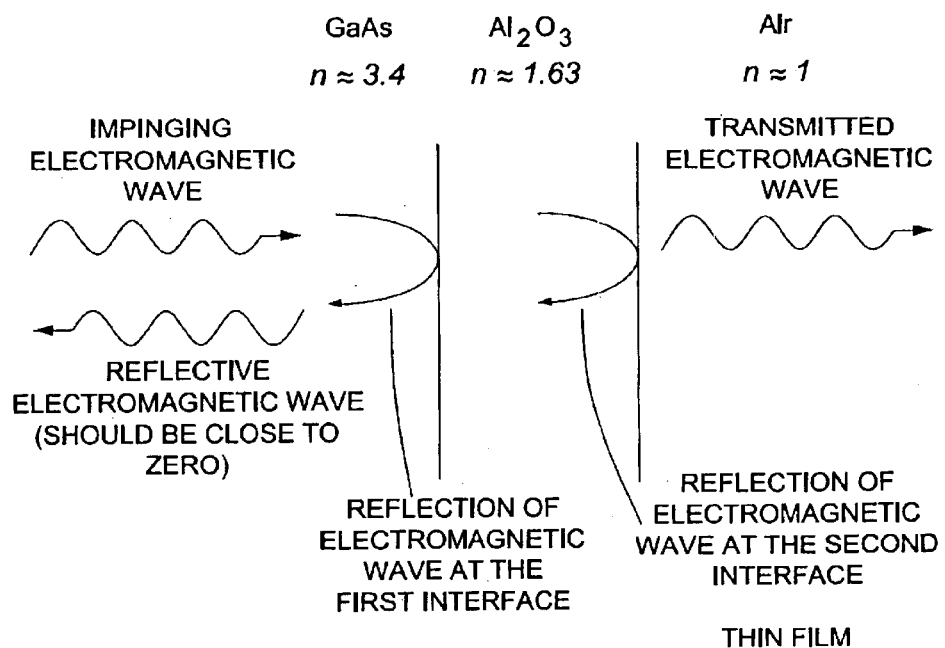
FIG. 3 illustrates the reflection principle of the electromagnetic wave impinging at a thin film layer.

FIG. 3 illustrates the principle involved in the anti-reflecting layer. As noted on the extreme left the impinging electromagnetic wave comes from the active region in the VCSEL and travels through the aluminum gallium arsenide material to the interface between the top surface of the VCSEL and the anti-reflective (AR) coating which may be, for example, $Al_2O_3$. The second interface is between the AR coating and air and the index of refractions (n) are shown for each of the three materials namely aluminum gallium arsenide wherein n=3.4; $Al_2O_3$ wherein n is approximately equal to 1.63 and air where n=1. Thus, in order to obtain a maximum transmission the thickness of the anti-reflecting layer needs to be precisely chosen based on the wavelength of the emission from the active region.

As shown in FIG. 2 the dielectric stack may be made of for example Si; $SiO_2$ or $Si_3N_4$ wherein each layer has an alternating high and low refractive index. The etch stop/anti-reflective coating, for example $Al_2O_3$, is selected such that the etchant used to etch the dielectric stack does not etch the coating. Accordingly, a good material for the anti-reflective coating is $Al_2O_3$ as it can easily be sputtered or evaporated on top of the device.

Figure 4:
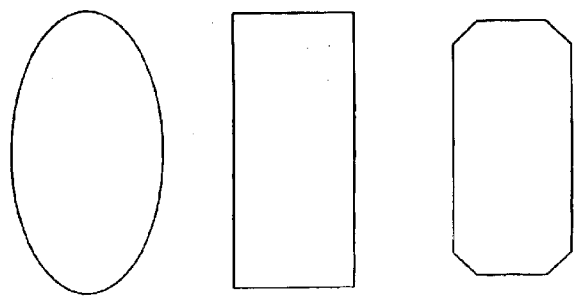
FIG. 4 illustrates possible shapes for the dielectric stack in order to break symmetry.

The aperture is typically 3 to 30 microns and the dielectric stack 1 to 10 microns. Preferably, the stack has a smaller diameter or dimension than the aperture for the benefit of the lower order modes. FIG. 4 shows examples of possible shapes of the dielectric stack. These include elliptical, rectangular and oxtahedral.

In fabrication the laser structure is typically produced in one epitaxial run. In a preferred embodiment of the present invention the laser structure, for example a VCSEL, has a top mirror with fewer layers than would be normally grown. The structure is then processed to form the VCSEL shown, generally, in FIG. 1. The fewer layers of the top mirror are used in order not to get too high a reflectivity when the dielectric stack is subsequently formed. After the VCSEL has been formed, the dielectric stack material is evaporated onto the VCSEL layer by layer. This dielectric material consists of, from bottom up, $Al_2$, $O_3$+Si+$Si_3N_4$+Si. As noted previously the dielectric stack may possibly be made up of other materials. The thickness of each layer is carefully controlled during evaporation. This accounts for the low reflectivity due to less number of mirrors in the VCSEL structure. The resulting VCSEL performs as a conventional multimode VCSEL, but does not have the favorable features as does a single (fundamental mode most desirable) mode VCSEL with one stable polarization state. What can be done to get the above mentioned features is to increase the optical losses for higher order modes, which favors the fundamental, and single, mode operation. However, it is not as easy to just form a mesa and thereby reduce the reflectivity for higher order modes (which are more laterally widespread) by etching away material. Such a procedure will not reduce the reflectivity sufficiently. It is known that the $Al_2O_3$ layer will be beneficial in this process. It has the exact thickness and refractive index to become an anti reflective (AR) layer if it is possible to etch down the Si+is $Si_3N_4$+Si and stop at the $Al_2O_3$ layer. The etchant used does not effect the AR coating (of course continuing the etching will finally damage the AR coating). With the choice of $Al_2O_3$ it is possible to not only manage the etching down to the $Al_2O_3$ but to stop the process in order to preserve the important thickness of $\lambda/4$, which is one of the conditions when forming the AR layer. Beside that, $Al_2O_3$ has the refractive index required to fulfill the condition for anti reflectivity.

Figure 5:
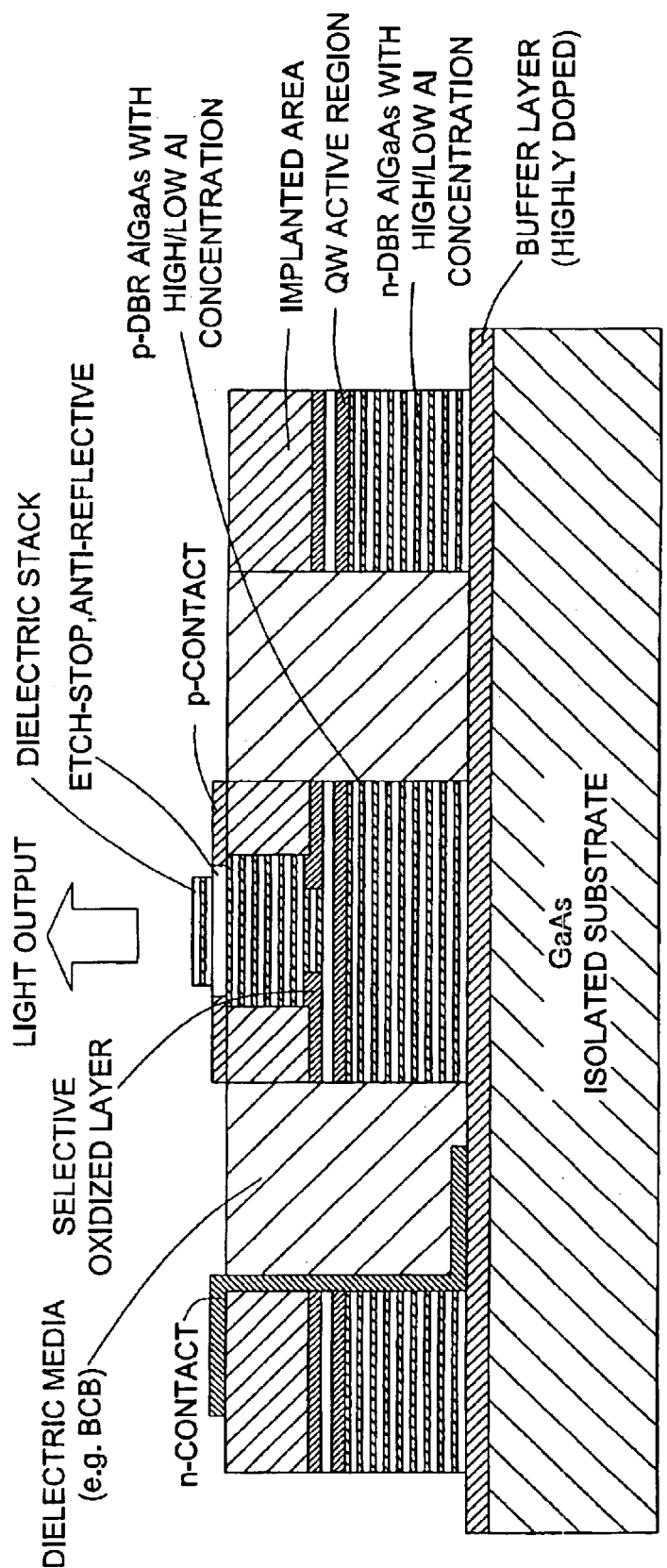
FIG. 5 is a cross sectional view of a second embodiment of the VCSEL structure according to the present invention.

FIG. 5 shows an alternate embodiment of the VCSEL with a dielectric stack in accordance with a second embodiment of the invention. In this embodiment an isolated gallium arsenide substrate is used and a highly doped buffer layer is used to assist in directing current flow from the top n contact to the n type lower Bragg mirror. Otherwise, the structure including the antireflective coating, the dielectric stack and p contact are the same as in the embodiment of the FIG. 2.

It is to be noted that in the figures the various elements are not drawn to scale.

Although particular embodiments of the invention have been described and illustrated it will be apparent to one skilled in the art that numerous changes can be made. It is intended, however, that such changes will, within the true scope of the invention as defined by the appended claims.

What is claimed is:

1. A vertical cavity surface emitting laser (VCSEL) having an active layer sandwiched between first and second mirrors and first and second contacts for use in providing operating power to the laser, the first contact being on the first mirror on the emitting side of the laser and having an aperture defining the emitting area, the improvement comprising an anti-reflecting coating in the aperture and a dielectric mirror structure on said anti-reflecting coating, said dielectric mirror structure having an area smaller than the aperture for transverse mode control, said anti-reflective coating also being an etch stop layer.

2. The VCSEL as defined in claim 1 wherein said dielectric mirror structure has stacked layers of dielectric material having first and second refractive indices.

3. The VCSEL as defined in claim 2 wherein said dielectric layers are made up of one of the materials in the group of Si, $SiO_2$ and $Si_3N_4$.

4. The VCSEL as defined in claim 1 wherein the thickness of the layer of antireflective material is selected for maximum transmission at the wavelength of the emission of the VCSEL.

5. The VCSEL as defined in claim 1 wherein the first mirror is doped with p-type material.

6. The VCSEL as defined in claim 1 wherein the shape of the dielectric stack is asymmetrical for polarization control.

7. The VCSEL as defined in claim 6 wherein said dielectric stack has an elliptical shape.

8. The VCSEL as defined in claim 6 wherein said dielectric stack has a rectangular shape.

9. The VCSEL as defined in claim 6 wherein the dielectric stack has a octahedral shape.

10. The VCSEL as defined in claim 1 wherein said antireflective layer is $Al_2O_3$.

11. A method of controlling mode selection in a vertical cavity surface emitting laser (VCSEL) having an active layer sandwiched between first and second mirrors, and contacts for use in providing operating power to the active layer, at least one of the contacts containing an aperture defining an emitting area of the laser, the method comprising; providing an antireflective coating on one of said mirrors and a dielectric mirror structure on said antireflective coating to selectively adjust a spatially dependent cavity loss within said surface emitting laser, said dielectric mirror structure having an area smaller than said aperture for transverse mode control.

12. The method as defined in claim 11 wherein said surface dielectric mirror structure comprises stacked alternating layers of first and second dielectric materials and wherein each of said first and second dielectric materials have a different refractive index.

13. The method as defined in claim 12 wherein the thickness of each of said first and second dielectric layers and said antireflective coating is carefully controlled during an evaporation process.

14. The method as defined in claim 13 wherein said dielectric layers are etched down to said antireflective coating to form a dielectric stack on top of said VCSEL, said anti-reflective coating acting as an etch stop.

* * * * *